(12) United States Patent
Chia et al.

(10) Patent No.: US 6,512,293 B1
(45) Date of Patent: Jan. 28, 2003

(54) MECHANICALLY INTERLOCKING BALL GRID ARRAY PACKAGES AND METHOD OF MAKING

(75) Inventors: Chok J. Chia, Cupertino, CA (US); Seng Sooi Lim, San Jose, CA (US); Wee K. Liew, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/875,055

(22) Filed: Jun. 5, 2001

(51) Int. Cl.[7] ............................................. H01L 23/04
(52) U.S. Cl. ..................... 257/730; 257/737; 438/666
(58) Field of Search ........................ 257/738, 713, 257/730, 737, 773; 439/70; 361/803

(56) References Cited

U.S. PATENT DOCUMENTS 5,834,843 A * 11/1998 Mori et al. ............... 257/723
2001/0051449 A1 * 12/2001 Davison et al. ............ 439/70

OTHER PUBLICATIONS

U.S. patent application Ser. No. 09/888,266, Davision et al., filed Dec. 2001.*

* cited by examiner

Primary Examiner—Tom Thomas
Assistant Examiner—Douglas W. Owens
(74) Attorney, Agent, or Firm—Sawyer Law Group, LLP

(57) ABSTRACT

A method and apparatus for providing a ball grid array assembly formed from interlocking ball grid array packages is disclosed. Each of the ball grid array packages has interlocking edge features for mechanical connection, whereby joining the plurality of ball grid array packages via the interlocking edge features forms the interlocking ball grid array assembly. The interlocking ball grid array assembly may then be mounted on a PC board as a single unit.

11 Claims, 1 Drawing Sheet

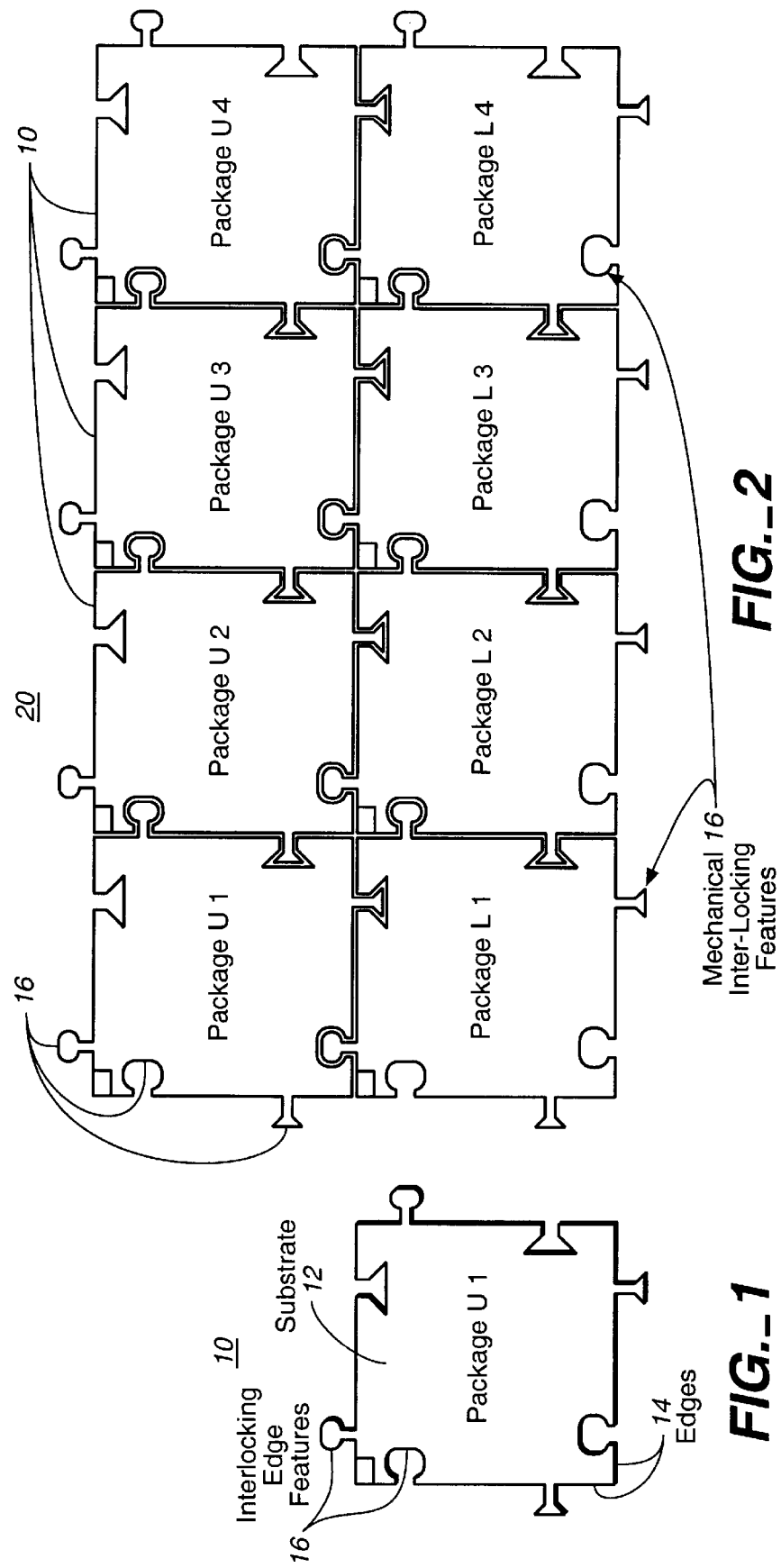

MECHANICALLY INTERLOCKING BALL GRID ARRAY PACKAGES AND METHOD OF MAKING

FIELD OF THE INVENTION

The present invention relates to packaging semiconductor devices, and more particularly to ball grid array type semiconductor packages.

BACKGROUND OF THE INVENTION

Integrated circuits are typically packaged before they are used with other components as part of a larger electronic system. Ball grid array (BGA) packages are constructed with die mounted on a substrate with bond pads on the die connected to conductive lines or traces on the surface substrate. These substrates may be either ceramic, printed circuit board laminate, or tape.

An array of solder balls mounted on the bottom of the substrate are used to attach the package to a PC board or motherboard, as opposed to molded plastic packages that use lead frames on the outer edges of the package substrate to attach the package to the PC board. Mounting the balls on the bottom of the package substrate reduces package size and decreases lead pitch, leading to higher assembly yields.

Although BGA packages are improvement over molded plastic packages, BGA packages have certain disadvantages. One disadvantage is that BGA packages must be placed on a PC board individually, which increases manufacturing time and cost. Another disadvantage is that BGA packages require a clearance between individual packages on the PC board, which increases the required size of the PC board.

Accordingly, what is needed is an improved ball grid array package. The present invention addresses such a need.

SUMMARY OF THE INVENTION

The present invention provides a ball grid array assembly formed from interlocking ball grid array packages, wherein each of the ball grid array packages has interlocking edge features for mechanical connection. The plurality of ball grid array packages are joined via the interlocking edge features to form an interlocking ball grid array assembly. The interlocking ball grid array assembly may then be mounted on a PC board as a single unit.

According to the system and method disclosed herein, the present invention provides a more efficient and cost effective method of using multiple ball grid array packages in an assembly.

BRIEF DESCRIPTION OF THE DRAWINGS

FIG. 1 is a block diagram illustrating an interlocking ball grid array package in accordance with the present invention.

FIG. 2 is a top view of an interlocking ball grid array assembly in accordance with the present invention.

DETAILED DESCRIPTION

The present invention relates to ball grid array semiconductor packages. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

FIG. 1 is a block diagram showing a top view of an interlocking ball grid array package in accordance with the present invention. The interlocking ball grid array package 10 includes a substrate 12 of either ceramic, PCB laminate or tape for mounting die and solder balls 13. In a preferred embodiment, the die are mounted on one surface of the substrate 12 and the solder balls 13 are mounted on the opposite side of the substrate 12. With tape substrates 12, both the die and the solder balls 13 mounted on the same side of the substrate 12.

In accordance with the present invention, at least two edges 14 of the package substrate 12 are formed with interlocking edge features 16 for mechanical connection. The edges 14 of other package substrates 12 are provided with corresponding edge features 16. In a preferred embodiment, each edge 14 of the substrate 12 is provided with one male and one female edge feature 16.

The edge features 16 may be either male or female and may be formed with lines or curves. Examples shapes for edge features 16 include a dovetail and an oval, as shown in FIG. 1. The interlocking edge features 16 can be formed during manufacturing of the substrate 12 or the package 10 by either mechanical routing or punching of the edges 14.

A single assembly can be made with two or more of the packages 10 by joining the edge features 16 of adjacent packages 10 such that the edge features 16 are mechanically locked together.

FIG. 2 is a top view of an assembly 20 of interlocking ball grid array packages 10 in accordance with the present invention. As shown, all four sides of each package 10 have been provided with the interlocking edge features 16. A row of four upper packages 10 and a row of four lower packages 10 have been joined to form a single assembly 20. The packages 10 located on the outside of each row are interconnected with two adjacent packages 10, while the packages 10 located in the middle the rows are interconnected with three adjacent packages 10. After the packages 10 are joined to form an assembly 20, the assembly 20 can then be mounted together as one unit on a PC board (not shown).

The present invention provides a more efficient and cost effective method of using multiple ball grid array packages 10 in an assembly. Joining multiple packages 10 together via the interlocking edge features 16 to form a larger assembly 20, especially for small packages 10, makes for easier mounting of the packages 10 on the PC board, improving the yields and cost of assembly. In addition, the joining of the packages 10 eliminates the need for a space between each package 10 on the PC board, thereby allowing for the reduction in the size of PC boards.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A ball grid array package, comprising:

a substrate for mounting die and solder balls; and four edges forming boundaries of the ball grid array package, wherein at least two of the edges include at least one male interlocking edge feature and at least one female interlocking edge feature for mechanically connecting the ball grid array package with at least one more ball grid array package.

2. The ball grid array package of claim 1 wherein mechanically connected ones of the ball grid array packages form a ball grid array assembly capable of being mounted on a PC board as a single unit.

3. The ball grid array of claim 2 wherein the interlocking edge features are formed with lines.

4. The ball grid array of claim 3 wherein the interlocking edge features are formed with curves.

5. The ball grid array of claim 4 wherein the interlocking edge features are formed during manufacturing by mechanical routing.

6. The ball grid array of claim 5 wherein the interlocking edge features are formed during manufacturing by punching of the edges.

7. A method for fabricating a ball grid array assembly, comprising the steps of:

(a) providing a plurality of ball grid array packages, each of the ball grid array packages being formed with interlocking edge features for mechanical connection, wherein in at least two edges of each of the ball grid array packages have one male edge feature and one female edge feature;

(b) forming the ball grid array assembly by joining the plurality of ball grid array packages via the interlocking edge features; and (c) mounting the ball grid array assembly on a PC board as a single unit.

8. The method of claim 7 further including the step of: forming the interlocking edge features with lines.

9. The method of claim 8 further including the step of: forming the interlocking edge features with curves.

10. The method of claim 9 further including the step of: forming the interlocking edge features during manufacturing by mechanical routing.

11. The method of claim 10 further including the step of: forming the interlocking edge features during manufacturing by punching of the edges.

* * * * *